United States Patent
Totsuka et al.

(10) Patent No.: US 6,933,250 B2
(45) Date of Patent: Aug. 23, 2005

(54) PROCESS FOR MANUFACTURING A SEMICONDUCTOR DEVICE

(75) Inventors: Masahiro Totsuka, Tokyo (JP); Tomoki Oku, Tokyo (JP); Ryo Hattori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 86 days.

(21) Appl. No.: 10/274,233

(22) Filed: Oct. 21, 2002

(65) Prior Publication Data

US 2003/0194881 A1 Oct. 16, 2003

(30) Foreign Application Priority Data

Apr. 15, 2002 (JP) ........................................ 2002-112321

(51) Int. Cl.[7] .................................................. H01L 21/31
(52) U.S. Cl. ........................................ 438/791; 438/792
(58) Field of Search ................................ 438/791, 792, 438/FOR 401, FOR 403; 257/E21.293

(56) References Cited

U.S. PATENT DOCUMENTS

| 3,856,587 A | 12/1974 | Yamazaki et al. | |
| 5,679,404 A | * 10/1997 | Patten et al. | 427/248.1 |
| 6,069,094 A | * 5/2000 | Matsumura et al. | 438/788 |
| 6,225,241 B1 | 5/2001 | Miyoshi | |
| 6,375,756 B1 | * 4/2002 | Ishibashi | 134/19 |

FOREIGN PATENT DOCUMENTS

| JP | 1225093 | 9/1989 |
| JP | 6-295901 | 10/1994 |
| JP | 10-209151 | 8/1998 |
| JP | 11219952 | 8/1999 |

OTHER PUBLICATIONS

Ishibashi, K; "Development of the Cat–CVD apparatus and its feasibility for mass production", *Thin Solid Films, Elsevier Sequoia, NL*, vol. 395, No. 1–2, pp. 55–60 (Sep. 3, 2001).

Minamikawa, T. et al.; "Preparation of $SiN_x$ passivation films for PZT ferroelectric capacitors at low substrate temperatures by catalytic CVD", *Preparation and Characterization, Elsevier Sequoia, NL*, vol. 395, No. 1–2, pp. 284–287 (Sep. 3, 2001).

* cited by examiner

Primary Examiner—George Fourson
Assistant Examiner—Julio J. Maldonado
(74) Attorney, Agent, or Firm—Leydig, Voit & Mayer, Ltd.

(57) ABSTRACT

A process of manufacturing a semiconductor device uses catalytic chemical vapor deposition. In the process, a reaction chamber containing a catalyzer and a substrate has gasses, including silane, ammonia, and hydrogen supplied to the reaction chamber. The gases are brought into contact with the catalyzer and then with the substrate to deposit a silicon nitride film.

6 Claims, 8 Drawing Sheets

PROCESS FOR MANUFACTURING A SEMICONDUCTOR DEVICE

BACKGROUND OF THE INVENTION

1. Field of the Invention

The present invention relates to a semiconductor device having a silicon nitride film and, more particularly, to a semiconductor device having a silicon oxide film.

2. Description of the Background Art

As a process of depositing a silicon nitride film on a semiconductor substrate such as a silicon substrate, a process of nitriding the silicon substrate from its surface and a process of depositing a silicon nitride film by chemical vapor deposition (hereinafter referred to as CVD) are dominantly used. Of these processes, catalytic chemical vapor deposition (hereinafter referred to as catalytic CVD) is useful. In catalytic CVD, source gases including monosilane gas and ammonia gas are supplied through a heated catalyzer onto a silicon substrate to deposit a silicon nitride film onto the silicon substrate.

Processes for depositing a silicon nitride film using this catalytic CVD will be described using FIG. 11. An apparatus for depositing a nitride film by using this catalytic CVD will be described first This film depositing apparatus includes a reaction chamber 60 in which a nitride film is deposited on a semiconductor substrate 51. In the reaction chamber 60, a substrate holder 52 holds the semiconductor substrate 51, a gas supply unit 54 supplies source gases 55 including silane gas and ammonia gas onto the semiconductor substrate 51, and a catalyzer 56 is interposed between the gas supply unit 54 and the substrate holder 52. It is noted that the catalyzer includes a metal heated by an electric current flowing therethrough. A carbon sheet 53 is sandwiched between the substrate holder 52 and the semiconductor substrate 51 to improve thermal contact. The film depositing apparatus has also gas tanks storing respectively the source gases including the silane gas and the ammonia gas and a gas tube connecting the gas tanks and a gas supply unit in the reaction chamber. The source gases are guided from the gas tanks through the gas tube and the gas supply unit into the reaction chamber.

Next, catalytic CVD for deposition of a nitride film will be described below. The process is performed in the following steps.

(a) A semiconductor substrate 51 is placed on the carbon sheet 53 arranged on the substrate holder 52 in the reaction chamber 60.

(b) The source gases 55 including silane gas and ammonia gas are guided from the gas tanks (not shown) storing respectively the source gases into the reaction chamber 60 through a gas tube 65 and the gas supply unit 54.

(c) The source gases 55 guided into the reaction chamber 60 are brought into contact with the heated catalyzer 56 and then supplied onto the semiconductor substrate 51.

(d) A silicon nitride film is deposited on the semiconductor substrate 51 from the supplied source gases 55.

The above process depositing of a silicon nitride film by using the conventional catalytic CVD has the following problems.

(1) The ammonia gas of the source gases had to be supplied at a flow rate about 100 times the flow rate of silane gas. Since the ammonia gas is bad for the environment, the flow rate of ammonia gas must be reduced.

(2) The thickness uniformity of an obtained silicon nitride film in the plane of the substrate 51 is poor. For example, when a silicon substrate has a diameter of 10.16 cm (4 inches), the thickness uniformity in the plane is poor, i.e., about 13%.

(3) Since the thermal contact between the semiconductor substrate 51 and the substrate holder 52 is insufficient, the semiconductor substrate 51 is overheated by heat radiation from the heated catalyzer 56. In particular, a compound semiconductor device using a GaAs substrate or the like cannot be placed at an excessively high temperature. More specifically, substrate temperature must be about 360° C. or lower in order to prevent an ohmic electrode from being deteriorated. On the other hand, when a gap between the catalyzer and the semiconductor substrate is set to prevent the semiconductor substrate from being overheated, the film deposition rate decreases. The substrate temperature must be 300° C. or higher in the deposition of the silicon nitride film to remove absorbed water in the substrate surface.

SUMMARY OF THE INVENTION

It is an object of the present invention to provide a high film depositing rate and to suppress a semiconductor substrate from being overheated in depositing a silicon nitride film.

It is another object of the present invention to improve the thickness uniformity of an obtained silicon nitride film.

It is still another object of the present invention to reduce an ammonia gas to be used.

In accordance with one aspect of the present invention, there is provided a process of manufacturing a semiconductor device by using catalytic chemical vapor deposition process. In the process, a reaction chamber is provided. The reaction chamber includes a catalyzer and a substrate therein. Gases including silane gas, ammonia gas, and hydrogen gas are provided. The gases are supplied to the reaction chamber, the gases are brought into contact with the catalyzer, and then towards onto the substrate so that the silicon nitride film is deposited on the substrate.

According to the process of manufacturing a semiconductor device of the present invention, the flow rate of ammonia gas can be reduced and a nitride film having sufficient film characteristics can be deposited. In this manner, ammonia gas which is bad for the environment can be reduced.

BRIEF EXPLANATION OF THE DRAWINGS

The present invention will become readily understood from the following description of preferred embodiments thereof made with reference to the accompanying drawings, in which like parts are designated by like reference numerals and in which.

DETAILED DESCRIPTION OF PREFERRED EMBODIMENTS

A process for depositing a silicon nitride film according to the embodiments of the present invention will be described with reference to the accompanying drawings as follows. In addition, an apparatus for depositing a silicon nitride film and a process of manufacturing a semiconductor device will be also described as follows.

Figure 1:
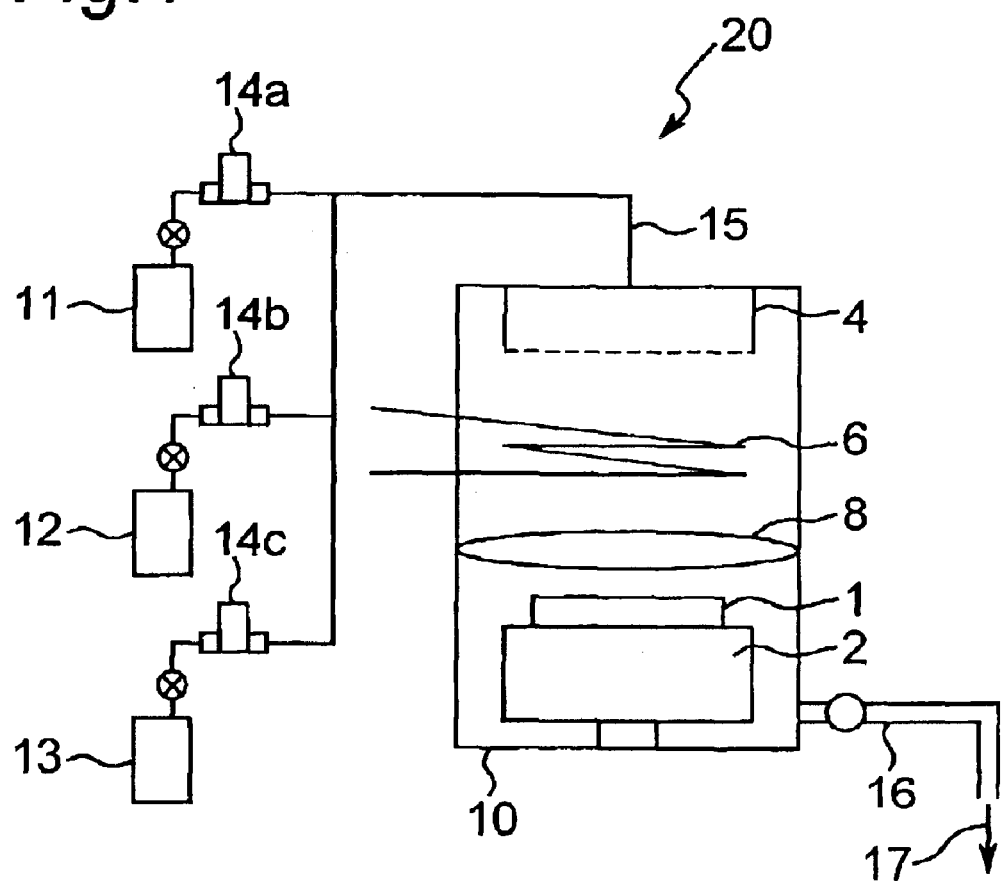
FIG. 1 is a schematic view of the configuration of an apparatus for depositing a silicon nitride film according to a first embodiment of the present invention.

A process and apparatus depositing a silicon nitride film according to the first embodiment of the present invention. The configuration of an apparatus 20 depositing this silicon nitride film will be described below with reference to the schematic view in FIG. 1. This film depositing apparatus 20 includes a reaction chamber 10 depositing a silicon nitride film on a semiconductor substrate 1 by catalytic CVD reaction process. This reaction chamber 10 includes a substrate holder 2 holding the semiconductor substrate 1, a gas supply unit 4 supplying source gases 5 containing a monosilane gas ($SiH_4$), an ammonia gas ($NH_3$), and a hydrogen gas ($H_2$) onto the semiconductor substrate 1 in the reaction chamber 10, and a catalyzer 6 interposed between the gas supply unit 4 and the semiconductor substrate 1. The reaction chamber 10 may include a shutter 8 shutting out flows of the source gases from the gas supply unit 4 onto the semiconductor substrate 1. In addition, this film depositing apparatus 20 includes gas tanks 11, 12, and 13 respectively storing gases such as monosilane gas, ammonia gas, and hydrogen gas which are arranged outside the reaction chamber 10. In addition, there are a gas pipe 15 connecting the gas tanks 11, 12, and 13, and the gas supply unit 4 inside of the reaction chamber 10. This film depositing apparatus 20 includes an equipment which can supply not only monosilane gas and ammonia gas but also hydrogen gas, and the hydrogen gas is additionally supplied, so that a silicon nitride film having sufficient film characteristics can be deposited even though flow rate of ammonia gas is reduced. Hereby, the flow rate of ammonia gas can be reduced. In this case, the monosilane gas ($SiH_4$) is used as silane gas. However, the silane gas is not limited to the monosilane gas, and another silane gas ($Si_nH_{2n+2}$) may be used.

In addition, in the film depositing apparatus 20 depositing this silicon nitride film, a pipe line for the source gases will be described below. This film depositing apparatus 20 includes the gas tanks 11, 12, and 13 storing the monosilane gas, the ammonia gas, and the hydrogen gas. The source gases 5 containing the monosilane gas, the ammonia gas, and the hydrogen gas are guided from the gas tanks 11, 12, and 13 into the reaction chamber 10 through flow rate adjusters 14a, 14b, and 14c, the gas pipe 15, and the gas supply unit 4. In addition, an exhaust pipe 16 is arranged in the reaction chamber 10 to discharge an exhaust gas from this exhaust pipe 16. Here, the monosilane gas, the ammonia gas, and the hydrogen gas are mixed in the gas pipe 15 connected to the reaction chamber 10, however, the present invention is not limited to this configuration, and a mixing chamber (not shown) mixing these gases in advance may be arranged between the gas tanks 11, 12, and 13 and the reaction chamber 10.

Next, the process of depositing a silicon nitride film will be described below. This film depositing process is performed by the following steps.

(a) In the reaction chamber 10, a GaAs substrate 1 is placed on the substrate holder 2 as a semiconductor substrate. The substrate 1 is held at a temperature of 300° C.

(b) The source gases 5 containing the monosilane gas, the ammonia gas, and the hydrogen gas are introduced from the gas tanks 11, 12, and 13 into the reaction chamber 10 through the gas pipe 15 and the gas supply unit 4. In this case, ratio of flow rates of ammonia gas/hydrogen gas in the source gases is set to 0.5 or lower. Hereby, the flow rate of ammonia gas which is bad for the environment can be reduced.

(c) The source gases 5 introduced into the reaction chamber 10 are brought into contact with the heated catalyzer 6 and then supplied onto the semiconductor substrate 1. For example, the following film depositing conditions are set. First, gas pressure in the reaction chamber 10 is set to 5 Pa. As the catalyzer 6, a tungsten wire having a surface temperature held at about 1750° C. is used. A distance d between the catalyzer 6 and the semiconductor substrate 1 is set to about 75 mm to suppress an increase in temperature of the substrate 1 to 50° C. or lower.

(d) A silicon nitride film is deposited on the semiconductor substrate 1 by the supplied source gases 5.

Figure 2:
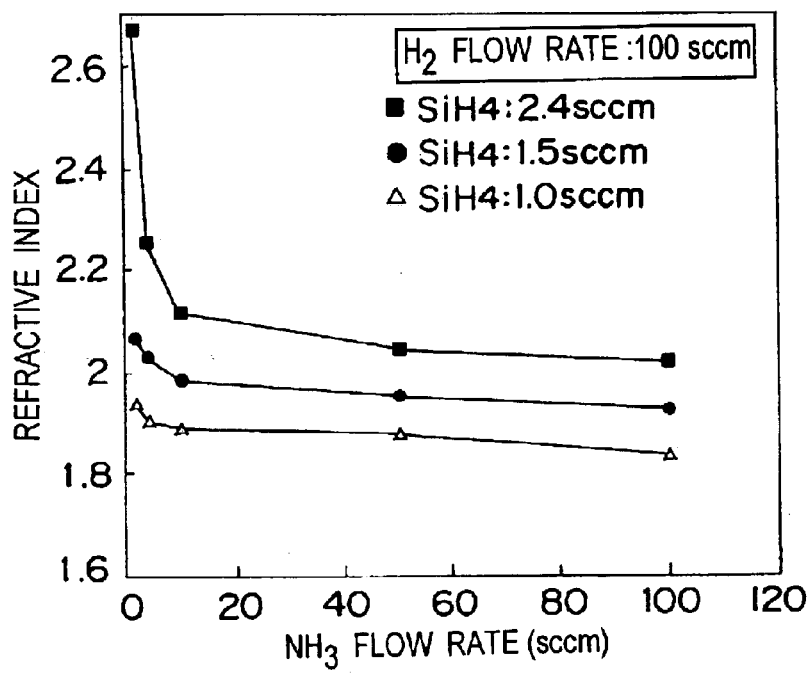
FIG. 2 is a graph of a relationship between flow rate of an ammonia gas in a process of depositing a silicon nitride film and a refractive index of an obtained nitride film according to the first embodiment of the present invention.
Figure 3:
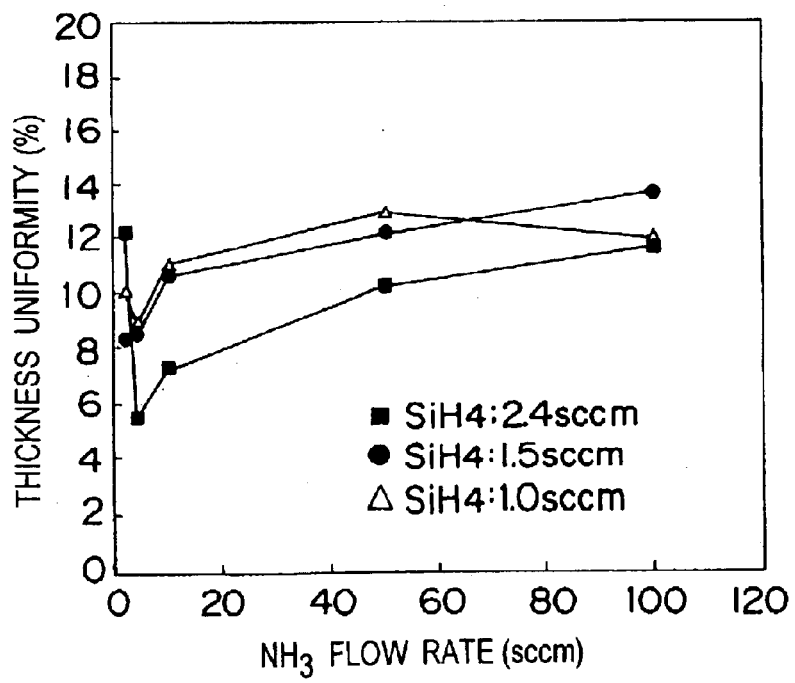
FIG. 3 is a graph of a relationship between the flow rate of ammonia gas in the process of depositing a silicon nitride film and film thickness uniformity of an obtained nitride film according to the first embodiment of the present invention.

In addition, in the process of depositing above silicon nitride film, a ratio of flow rates of the respective gases supplied into the reaction chamber will be examined. As the flow rates of the gases to be supplied, flow rate of hydrogen gas to be added is set to 100 sccm, and three flow rates of monosilane gas are set to 1.0 sccm, 1.4 sccm, and 2.4 sccm, respectively. Note that the "sccm" is the unit of flow rate and means "standard cc/min". More specifically, the "sccm" represents flow rate per minute in standard condition (0° C. and atmospheric pressure (1,013 hPa)). In this case, results obtained by examining flow rates of ammonia gas and the characteristics of an obtained nitride film are shown in FIGS. 2 and 3. FIG. 2 is a graph showing a relationship between the flow rate of ammonia gas and a refractive index of the obtained nitride film. A refractive index of a silicon nitride film $Si_3N_4$ having a stoichiometric ratio is about 2.05 and it is considered that a nitrogen quantity is reduced as the refractive index of the film increases.

As is apparent from FIG. 2, the refractive index gradually decreases as the flow rate of ammonia gas increases. On the other hand, when the flow rate of ammonia gas is set to about 10 sccm or less, the refractive index of the film sharply increases, and the nitrogen content decreases. For example, in order to obtain a silicon nitride film having a refractive index of 2.00 to 2.05 which is almost equal to that of a conventional art, the flow rate of monosilane gas may be set to 1.5 sccm, and a ratio of flow rates of ammonia gas/hydrogen gas may be set within a range of 0.04 to 0.5. The present invention is not limited to this values, and film depositing conditions with which desired film characteristics can be obtained may be set.

FIG. 3 is a graph showing a relationship between the flow rate of ammonia gas and thickness uniformity of the obtained nitride film. The thickness uniformity is calculated by the following step. First, the film thicknesses of the obtained silicon nitride film are measured at a plurality of measurement points, the maximum value and the minimum value are defined. Next, the thickness uniformity is calculated on the basis of the following equation:

Thickness uniformity=(maximum value−minimum value)/(maximum value+minimum value).

Referring to FIG. 3, the thickness uniformity decreases as the flow rate of ammonia gas is decreased, and the uniformity of the film thickness is improved. Furthermore, when the flow rate of the ammonia gas is reduced, the thickness uniformity increases, and the uniformity is deteriorated. Therefore, it is preferable that a silicon nitride film is deposited with a film depositing condition with which the thickness uniformity of the obtained nitride film is about 10% or lower.

According to FIGS. 2 and 3, in the step of supplying gases, the ratio of flow rates of ammonia gas/hydrogen gas is preferably set to 0.5 or lower. Additionally, a ratio of flow rates of ammonia gas/monosilane gas is preferably set to 20 or lower.

Figure 4:
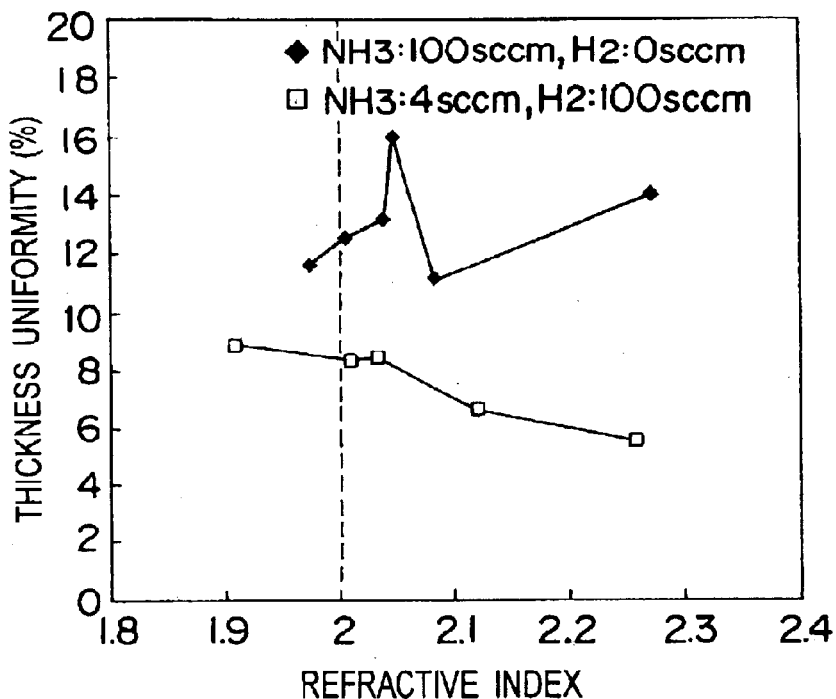
FIG. 4 is a graph of a relationship between the presence/absence of hydrogen gas in the process of depositing a silicon nitride film and the characteristics of an obtained nitride film according to the first embodiment of the present invention.

In the process of depositing a silicon nitride film, the effect of the hydrogen gas serving as additional gas to be added to the monosilane gas and the ammonia gas will be described below with reference to FIG. 4. FIG. 4 is a graph showing a relationship between the presence/absence of hydrogen gas and the characteristics of an obtained silicon nitride film. FIG. 4 shows the characteristics of a nitride film obtained when flow rate of ammonia gas is set to 100 sccm and flow rate of hydrogen gas is set to 0 sccm and a nitride film obtained when flow rate of ammonia gas is set to 4 sccm and flow rate of hydrogen gas is set to 100 sccm. As is apparent from FIG. 4, when the hydrogen gas is added, thickness uniformity is improved even though the refractive index is not changed.

Figure 5:
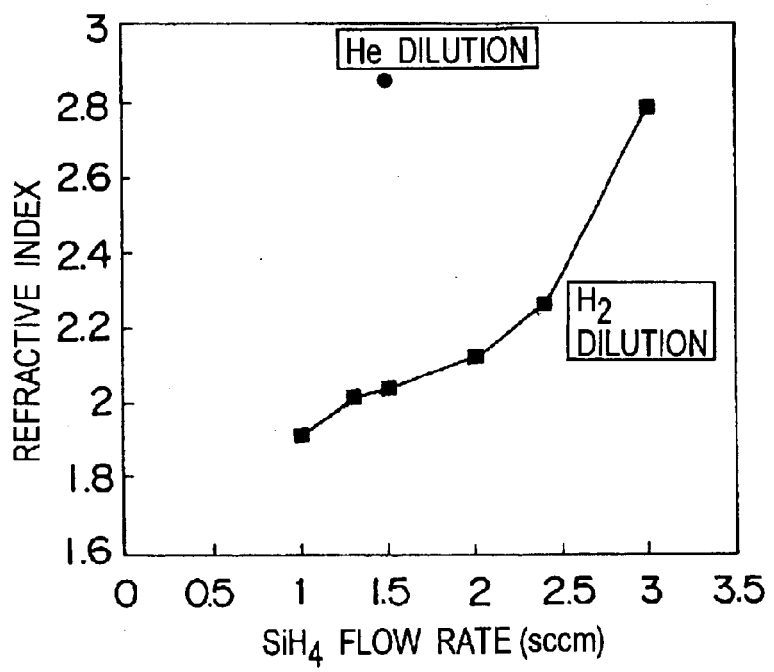
FIG. 5 is a graph of a relationship between different gas mixtures in the process of depositing a silicon nitride film and refractive index of an obtained nitride film according to the first embodiment of the present invention.

In addition, in the process of depositing this silicon nitride film, the effect of selection of hydrogen gas as an additional gas will be described below with reference to FIG. 5. FIG. 5 is a graph of a relationship between types of additional gases and a refractive index of an obtained nitride film. FIG. 5 shows a relationship between flow rate of monosilane gas and a refractive index of an obtained nitride film when hydrogen is used as an additional gas. FIG. 5 also shows an example obtained when helium gas is used as additional gas. As shown in FIG. 5, when the helium gas is used as the additional gas, the refractive index of the obtained nitride film is higher than a refractive index obtained when hydrogen gas is used, and a nitrogen content of the film may increase. Therefore, when hydrogen gas is selected as additional gas, the nitrogen content of the obtained nitride film can be controlled. Not only a silicon nitride film $Si_3N_4$ having a stoichiometric ratio but also a nitride film having a desired film composition can be manufactured.

In addition, the characteristics of a silicon nitride film (first example) obtained by the process of depositing a silicon nitride film will be described below in comparison with the characteristics of a silicon nitride film (first comparative example) obtained by a conventional process of depositing a silicon nitride film.

The characteristics of a silicon nitride film obtained by a conventional process of depositing a silicon nitride film will be described below. In this conventional silicon nitride film, a refractive index falls within a range of about 2.00 to 2.05, and hydrogen concentrations are $2 \times 10^{21}$ cm$^{-3}$ as an N—H bond and $4 \times 10^{20}$ cm$^{-3}$ as an Si—H bond. An etching rate using a buffered hydrofluoric acid (BHF 6:1) was about 9 nm/min. In addition, a tension serving as an index of difficulty of film peeling was $4 \times 10^9$ dyn/cm$^2$.

The characteristics of a silicon nitride film obtained by the process of depositing a silicon nitride film according to the present invention will be described below. In the obtained silicon nitride film, the refractive index fell within the range of about 2.00 to 2.05. Hydrogen concentrations were $1 \times 10^{21}$ cm$^{-3}$ as an N—H bond and $4 \times 10^{20}$ cm$^{-3}$ as an Si—H bond. In this film depositing process, although hydrogen gas is added to the source gases, the hydrogen concentrations are almost equal to the concentrations of hydrogen contained in the above conventional nitride film. In addition, an etching rate using a buffered hydrofluoric acid (BHF 6:1) was about 4 nm/min. This etching rate is smaller than that of the above conventional nitride film, and the planarity of the film is better than that of the comparative example. In addition, a tension serving as an index of difficulty of film peeling was $1 \times 10^9$ dyn/cm2.

Figure 6A:
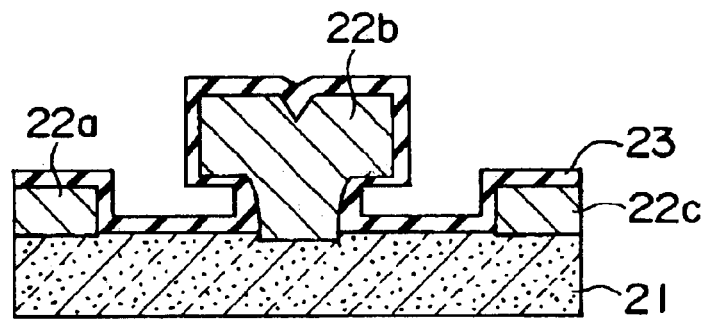
FIGS. 6A, 6B, and 6C are schematic views of several examples of semiconductor devices manufactured by a process of manufacturing a semiconductor device according to the first embodiment of the present invention.
Figure 6B:
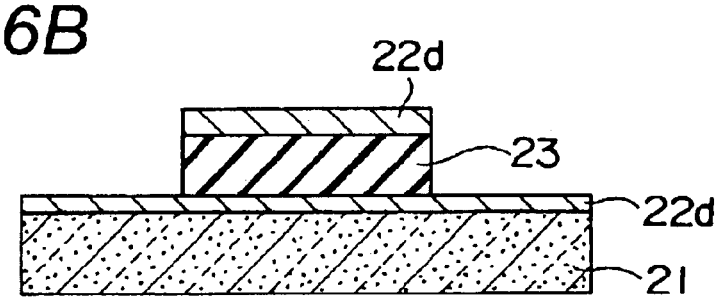
Figure 6C:
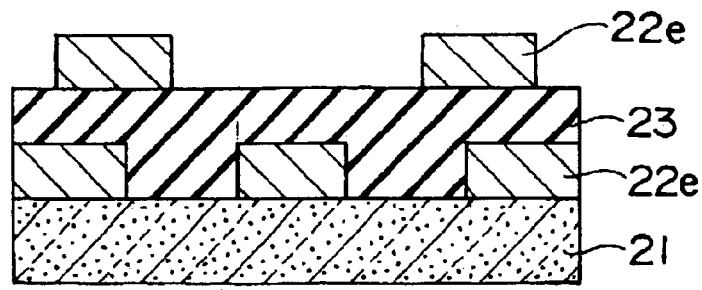

In a process of manufacturing a semiconductor device may include the process of depositing a silicon nitride film. In addition, we will explain some applications of a semiconductor device having a silicon nitride film obtained by the process of manufacturing a semiconductor device including the process of depositing a silicon nitride film, as described below. The semiconductor device having the silicon nitride film can be used in various applications. For example, FIGS. 6A to 6C are schematic views showing several examples of semiconductor devices manufactured by the process of manufacturing a semiconductor device. FIG. 6A shows a case in which a semiconductor device uses the silicon nitride film as a surface protection film, FIG. 6B shows a case in which a semiconductor device uses the silicon nitride film as a capacitor, FIG. 6C shows a case in which a semiconductor device uses the silicon nitride film as an insulating interlayer. These cases are only examples and the present invention is not limited to the cases. The silicon nitride film obtained by the process of manufacturing this semiconductor device can also be used as a cap film used in annealing, a through film in ion implantation, or an end face protection film of a semiconductor layer.

Figure 7:
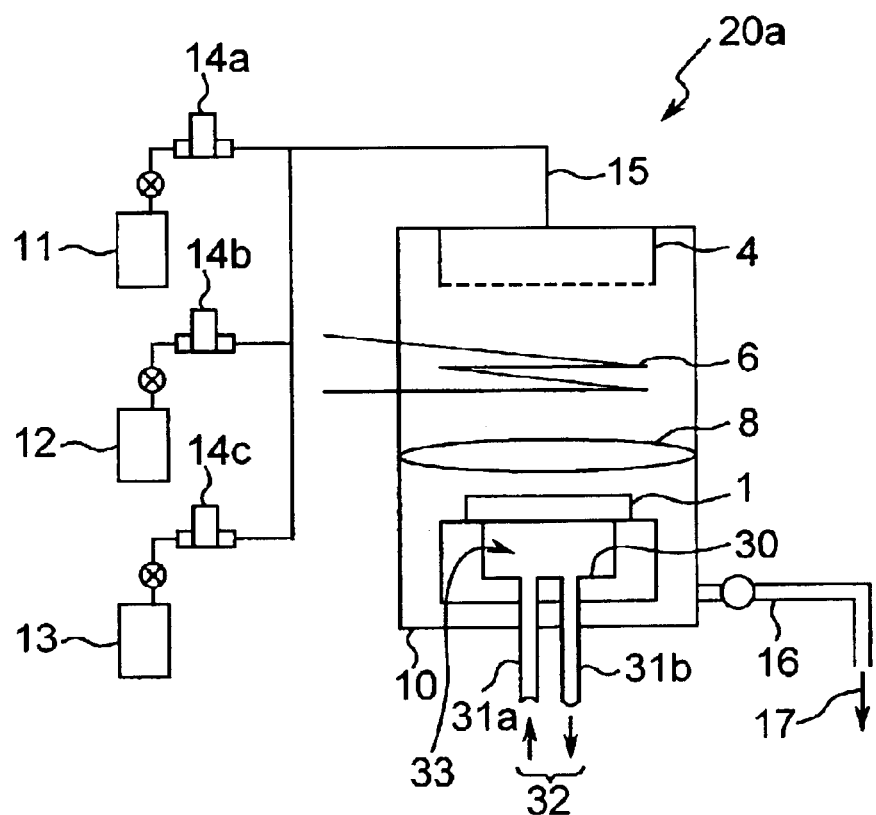
FIG. 7 is a schematic view of the configuration of an apparatus for depositing a silicon nitride film according to a second embodiment of the present invention.
Figure 8:
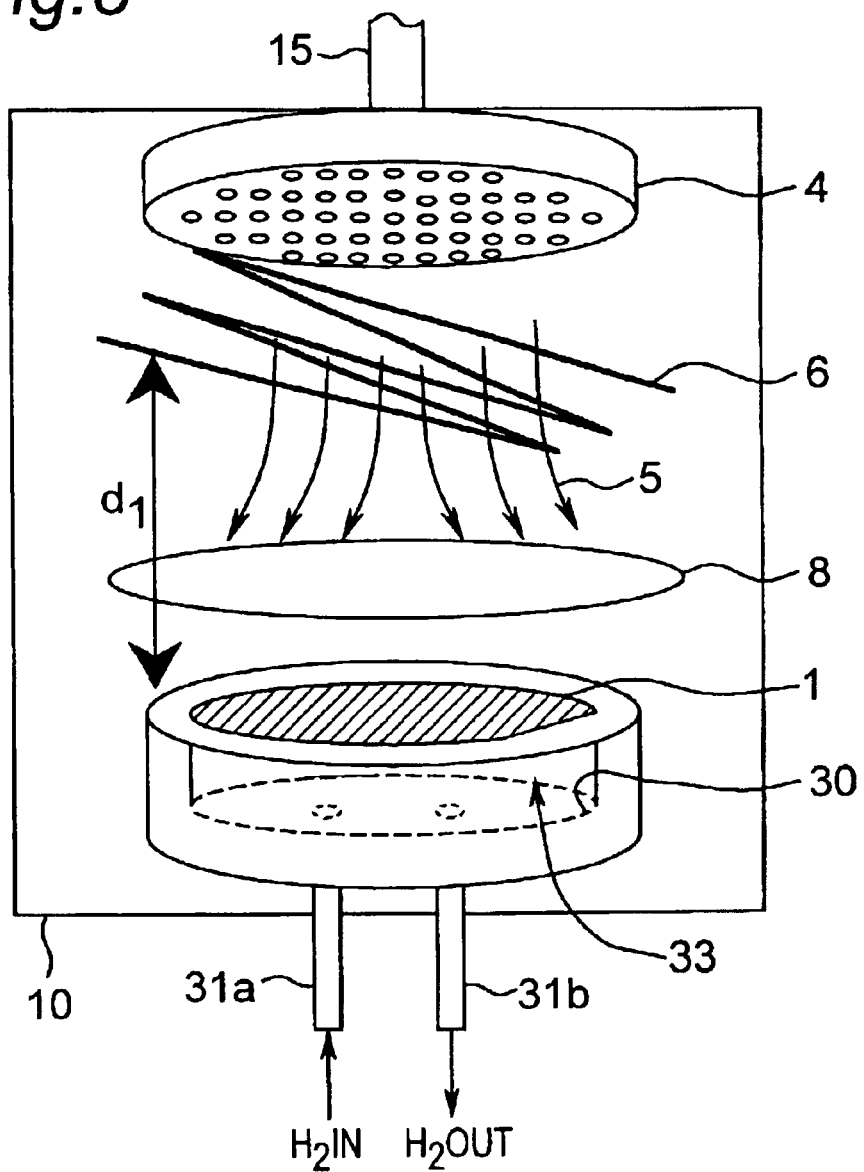
FIG. 8 is a pattern diagram of the interior of a reaction chamber of the film depositing apparatus shown in FIG. 7.

A process and apparatus for depositing a silicon nitride film according to the second embodiment of the present invention will be described below with reference to FIGS. 7 and 8. FIG. 7 is a schematic view showing the configuration of the film depositing apparatus, and FIG. 8 is a pattern diagram of the circumference of the reaction chamber in FIG. 7. A film depositing apparatus 20a for this silicon nitride film is compared with the film depositing apparatus of depositing a silicon nitride film according to the first embodiment. As shown in the schematic view in FIG. 7, the film depositing apparatuses are different from each other in that a space 33 is provided between the rear surface of a semiconductor substrate 1 and a recessed portion 30 of a substrate holder 2 and that gas pipes 31a and 31b for circulating cooling gas 32 in the space 33 are further arranged. The gas 32 is circulated in the space 33 between the semiconductor substrate 1 and the substrate holder 2 to cool the substrate, so that the substrate 1 can be suppressed from being overheated by heat radiated from a heated catalyzer 6. In this manner, the semiconductor substrate 1 is suppressed from being overheated while a distance d between the catalyzer 6 and the substrate 1, and a film depositing rate can be increased. When hydrogen gas is used as the cooling gas 32, even though the gas is flowed out of the space 33 of the substrate holder 2, the hydrogen gas functions as additional gas. Therefore, hydrogen gas is preferable as the cooling gas.

Next, we will explain the substrate holder 2 in this film depositing apparatus 20a as follows. In this substrate holder 2, as shown in FIGS. 7 and 8, the recessed portion 30 which is smaller than the substrate 1 is arranged at a position where the semiconductor substrate 1 is placed. When the semiconductor substrate 1 is placed on the substrate holder 2, the space 33 is framed by the rear surface of the substrate 1 and the recessed portion 30 of the substrate holder 2. This substrate holder 2 also includes the gas pipes 31a and 31b circulating the gas 32 cooling the semiconductor substrate 1 in the space 33. The gas 32 is circulated in the space 33 from the gas pipes 31a and 31b, so that the semiconductor substrate 1 is cooled by the circulated gas 32. In this manner, the substrate 1 can be suppressed from being overheated by heat radiated from the heated catalyzer 6. Hydrogen gas is preferable as the cooling gas 32 circulated in the space 33. However, the gas 32 is not limited to the hydrogen gas, inert gas such as helium gas or nitrogen gas may be used. The pressure of the gas 32 in the space 33 is preferably held at about 100 Pa to 1,000 Pa, more preferably, about 400 Pa. Additionally, the pressure of the gas 32 in the space 33 is not limited to the range, and may be set to up to about 1/10 of the atmospheric pressure.

We will explain a condition for depositing a silicon nitride film in the process of depositing a silicon nitride film. We will also explain the relationships between the distances d between the catalyzers 6 and the semiconductor substrates 1 and increases in temperature of the substrates of second comparative example and second example are compared with each other. The degrees of increase in temperature are evaluated by using a temperature difference $\Delta T$ of the substrate 1 when shutters 8 and 58 are opened and closed in FIGS. 7, 8, and 11.

Figure 11:
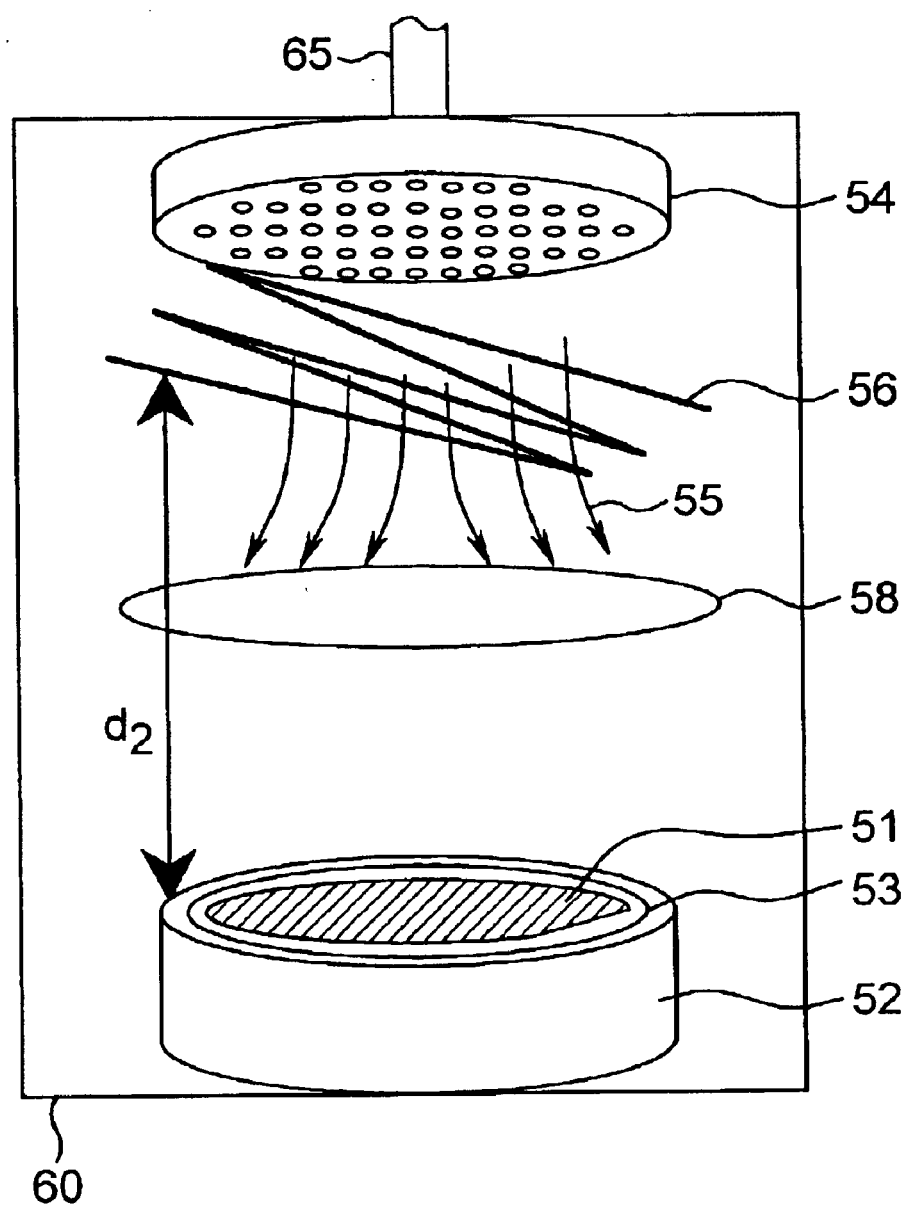
FIG. 11 is a schematic view of the configuration of an apparatus for depositing a silicon nitride film by conventional catalytic CVD.

In the conventional process of depositing a silicon nitride film shown in FIG. 11, the temperature difference $\Delta T$ of the substrate 51 obtained by opening and closing a shutter 58 was 48° C. when a distance $d_2$ between the catalyzer 56 and the semiconductor substrate 51 was 75 mm. When the distance $d_2$ was 50 mm, the temperature difference $\Delta T$ of the semiconductor substrate 51 was 76° C. In this case, in order to suppress the temperature difference $\Delta T$ of the substrate 51 to 50° C. or lower, the distance $d_2$ between the catalyzer 56 and the semiconductor substrate 51 must be 75 mm. A film depositing rate of the silicon nitride film in this case was about 4.3 nm/min.

The process of depositing a silicon nitride film according to the second embodiment of the present invention is shown in FIGS. 7 and 8. The temperature difference $\Delta T$ of the substrate 1 obtained by opening and closing the shutter 8 was 20° C. when a distance $d_1$ between the catalyzer 6 and the semiconductor substrate 1 was 75 mm. When the distance $d_1$ was 50 mm, the temperature difference $\Delta T$ was 28° C. As described above, even though the distance $d_1$ between the catalyzer 6 and the semiconductor substrate 1 is 50 mm, the temperature difference $\Delta T$ can be suppressed to 50° C. or lower. Therefore, a film depositing rate could be increased to 9.5 nm/min.

A process of depositing a silicon nitride film according to the third embodiment of the present invention will be described below. This process of depositing a silicon nitride film is different from the process of depositing a silicon nitride film according to the first embodiment in that flow rate of ammonia gas is reduced and that flow rate of hydrogen gas is reduced. When the flow rate of hydrogen gas is reduced in this manner, a film depositing rate of a nitride film can be increased.

Figure 9:
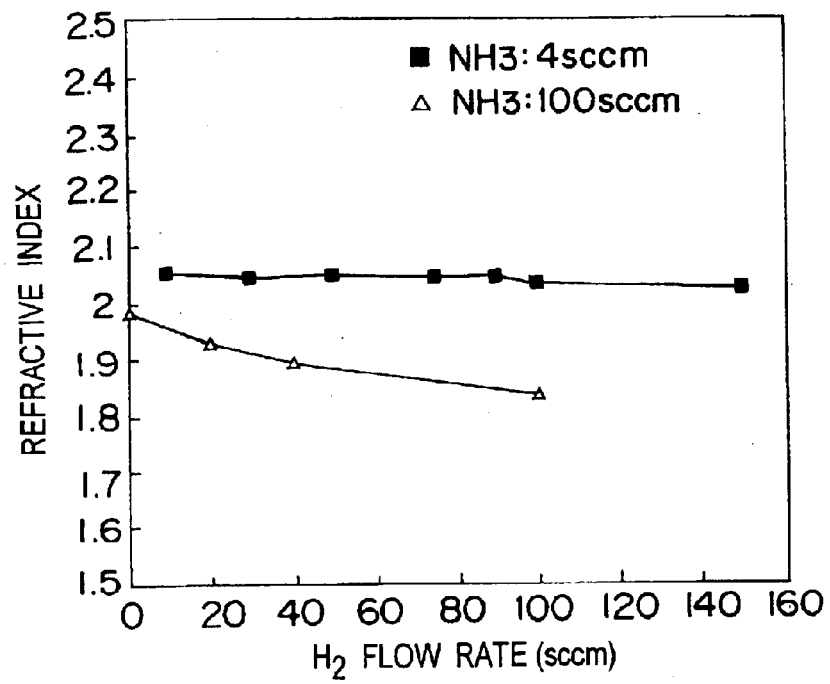
FIG. 9 is a graph of a relationship between a flow rate of hydrogen in a process of depositing a silicon nitride film and refractive index of an obtained nitride film according to a third embodiment of the present invention.
Figure 10:
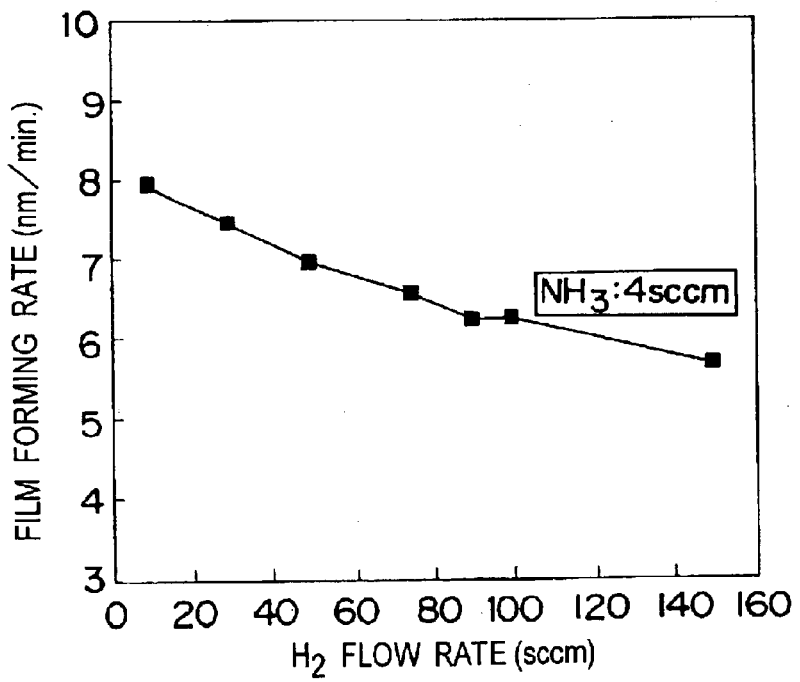
FIG. 10 is a graph on a relationship between the flow rate of hydrogen in a process of depositing a silicon nitride film and film depositing rate of an obtained nitride film according to the third embodiment of the present invention.

Next, in this process of depositing a silicon nitride film, flow rate of hydrogen gas serving as additional gas will be described below with reference to FIGS. 9 and 10. FIG. 9 is a graph of a relationship between flow rate of hydrogen gas and a refractive index of an obtained nitride film. FIG. 9 shows a relationship between flow rate of hydrogen gas and a refractive index of an obtained nitride film when 4 sccm or 100 sccm is selected as flow rate of ammonia gas. As shown in FIG. 9, even though the flow rate of hydrogen gas is changed, the refractive index of the nitride film rarely changes. FIG. 10 is a graph showing a relationship between flow rate of hydrogen gas and a film depositing rate of a silicon nitride film. Referring to FIG. 10, the film depositing rate decreases as the flow rate of hydrogen increases. Therefore, the flow rate of hydrogen gas can be reduced to about 10 sccm. When the flow rate of ammonia gas and the flow rate of monosilane gas are set to 4 sccm and 1.5 sccm, respectively, the flow rate of hydrogen must be at least about 10 sccm to maintain predetermined gas pressure. When the flow rate of hydrogen gas is set to 10 sccm, as shown in FIG. 10, a film depositing rate of about 8 nm/min can be obtained.

We will explain a process of depositing a silicon nitride film according to the fourth embodiment of the present invention as follows. This process of depositing a silicon nitride film is different from the process of depositing a silicon nitride film according to the third embodiment in that a substrate is cooled with hydrogen gas in the step of depositing a silicon nitride film. In this case, by using the film depositing apparatus 20a for a silicon nitride film according to the second embodiment shown in FIG. 7, a hydrogen gas 32 is circulated in a space 33 which is provided by the rear surface of a substrate 1 and a recessed portion 30 of a substrate holder 2 to cool the substrate 1. Even though the distance between a catalyzer 6 and the substrate 1 is set to 50 mm, the substrate can be prevented from being overheated. In addition, the supply condition of the gases is set to equal to that in the third embodiment, and the flow rate of hydrogen and the flow rate of ammonia gas are set to 10 sccm and 4 sccm, respectively. In this manner, the film depositing rate of a silicon nitride film can be increased to 11.5 nm/min.

According to the process of manufacturing a semiconductor device of the present invention, the silicon nitride film on a substrate is deposited by using catalytic CVD using monosilane gas and ammonia gas. In this case, in addition to the above source gases, hydrogen gas is additionally supplied. When a hydrogen gas is added to the source gases, the flow rate of ammonia gas can be reduced and a nitride film having sufficient film characteristics can be deposited. In this manner, ammonia gas which is bad for the environment can be reduced.

In addition, in the process of manufacturing a semiconductor device according to the present invention, a ratio of flow rates of ammonia gas/hydrogen gas is set to 0.5 or lower. Therefore, the flow rate of ammonia gas can be reduced.

Furthermore, in the process of manufacturing a semiconductor device according to the present invention, ratio of flow rates of ammonia gas/monosilane gas is set to 20 or lower. Since a conventional ratio of flow rates of ammonia gas/monosilane gas is about 100 times the ratio of the present invention, the flow rate of monosilane gas can be reduced.

Still furthermore, in the process of manufacturing a semiconductor device according to the present invention, gases containing a source gas and a hydrogen gas are supplied onto a substrate while cooling the substrate by a second gas. Therefore, the substrate can be suppressed from being overheated by heat radiated from a heated catalyzer.

Still furthermore, in the process of manufacturing a semiconductor device according to the present invention, hydrogen gas is used as second gas for cooling the substrate. Therefore, even though the hydrogen is flowed out of a reaction chamber, the hydrogen gas functions as additional gas and does not adversely affect deposition of a nitride film.

The apparatus depositing a silicon nitride film according to the present invention includes pipe equipment additionally supplying hydrogen gas to monosilane gas and ammonia gas. When the hydrogen gas is added to the source gases by this pipe equipment, the flow rate of ammonia gas can be reduced, and a nitride film having sufficient film characteristics can be deposited. Therefore, ammonia gas which is bad for the environment can be reduced.

Furthermore, in the apparatus depositing a silicon nitride film according to the present invention, a substrate holder has a recessed portion on a side on which a substrate is placed. When the substrate is placed, a space is provided between the rear surface of the substrate and the recessed portion of the substrate holder. A gas pipe circulating gases in the space is arranged. The gas is circulated in the space to cool the substrate, so that the substrate can be suppressed from being overheated by heat radiated from a heated catalyzer. Therefore, the substrate is suppressed from being overheated while a distance d between the catalyzer and the substrate is decreased, and a film depositing rate can be increased.

Still furthermore, in the process of depositing a silicon nitride film according to the present invention, hydrogen gas is used as gas for cooling a substrate. Therefore, even though the hydrogen gas flowed into a reaction chamber, the hydrogen gas functions as additional gas. Consequently, the hydrogen gas does not adversely affect depositing the silicon nitride film.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A process of manufacturing a semiconductor device using catalytic chemical vapor deposition comprising:

simultaneously supplying silane, ammonia, and hydrogen to a reaction chamber with a flow rate ratio of the ammonia to the hydrogen not lower than 0.04 and not higher than 0.5;

bringing the silane, ammonia, and hydrogen into contact with a catalyzer disposed within the reaction chamber; and after bringing the silane, ammonia, and hydrogen into contact with the catalyzer, bringing the silane, ammonia, and hydrogen into contact with a substrate in the reaction chamber, forming a silicon nitride film on the substrate.

2. The process of manufacturing a semiconductor device according to claim 1, comprising supplying a cooling gas to the substrate and cooling the substrate, while supplying the silane, ammonia, and hydrogen to the reaction chamber.

3. The process of manufacturing a semiconductor device according to claim 2, wherein the cooling gas is hydrogen.

4. A process of manufacturing a semiconductor device using catalytic chemical vapor deposition comprising:

simultaneously supplying silane, ammonia, and hydrogen to a reaction chamber, with a flow rate ratio of the ammonia to the silane not higher than 20 and a flow rate ratio of the ammonia to the hydrogen not higher than 0.5;

bringing the silane, ammonia, and hydrogen into contact with a catalyzer disposed within the reaction chamber; and after bringing the silane, ammonia, and hydrogen into contact with the catalyzer, bringing the silane, ammonia, and hydrogen into contact with a substrate in the reaction chamber, forming a silicon nitride film on the substrate.

5. The process of manufacturing a semiconductor device according to claim 4, comprising supplying a cooling gas to the substrate and cooling the substrate, while supplying the silane, ammonia, and hydrogen to the reaction chamber.

6. The process of manufacturing a semiconductor device according to claim 5, wherein the cooling gas is hydrogen.

* * * * *